United States Patent [19]

Kuo et al.

[11] Patent Number: 4,536,941
[45] Date of Patent: Aug. 27, 1985

[54] METHOD OF MAKING HIGH DENSITY DYNAMIC MEMORY CELL

[76] Inventors: Chang-Kiang Kuo, 9639 Vista View Dr., Austin, Tex. 78750; Shyh-Chang Tsaur, 12247 Monticeto, Stafford, Tex. 77477

[21] Appl. No.: 470,654

[22] Filed: Feb. 28, 1983

Related U.S. Application Data

[62] Division of Ser. No. 133,376, Mar. 21, 1980, Pat. No. 4,376,983.

[51] Int. Cl.³ .................. H01L 21/70; H01L 21/22; B01J 17/00
[52] U.S. Cl. .................... 29/571; 29/576 B; 29/578; 148/1.5; 148/187; 357/51; 357/59; 357/91
[58] Field of Search ............ 29/571, 576 B, 578; 148/1.5, 187; 357/91, 59, 51

[56] References Cited

U.S. PATENT DOCUMENTS

| | | | |
|---|---|---|---|
| 4,240,195 | 12/1980 | Clemen et al. | 29/571 |
| 4,270,262 | 6/1981 | Hori et al. | 29/571 |
| 4,334,236 | 6/1982 | Hoffmann et al. | 357/59 |
| 4,335,505 | 6/1982 | Shibata et al. | 29/577 R |
| 4,350,536 | 9/1982 | Nakano et al. | 148/1.5 |
| 4,388,121 | 6/1983 | Mohan Rao | 148/1.5 |
| 4,397,077 | 8/1983 | Derbenwick et al. | 29/571 |
| 4,403,394 | 9/1983 | Shepard et al. | 29/571 |

OTHER PUBLICATIONS

Rideout IBM-TDB, 21 (1979), 3823.

Primary Examiner—Upendra Roy

[57] ABSTRACT

A dynamic read/write memory cell of the one transistor N-channel silicon gate type is made by a triple-level polysilicon process which allows the bit lines to be formed by metal strips which have low resistance and which can cover the storage capacitors for alpha particle protection. Metal-to-silicon contacts are made through an intervening polysilicon segment which allows the underlying N+ silicon region to be much smaller than in prior cells. The polysilicon segment also prevents the occurrance of problems with spiking of metal through shallow implanted N+ regions.

15 Claims, 10 Drawing Figures

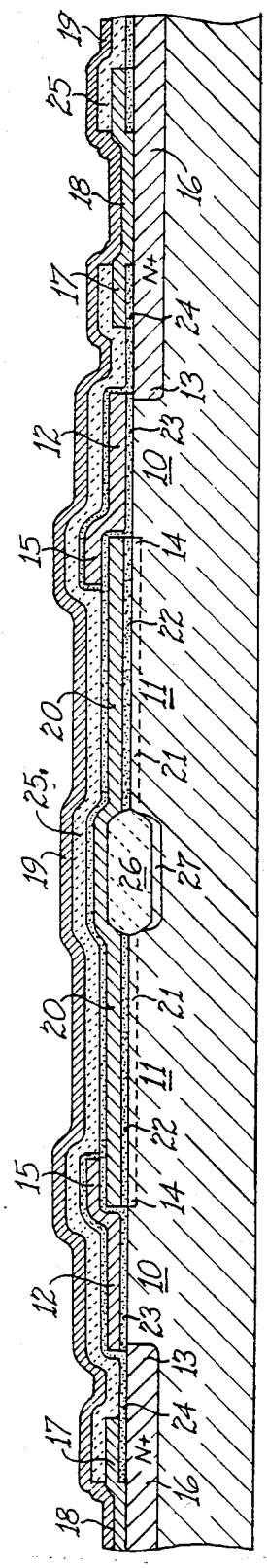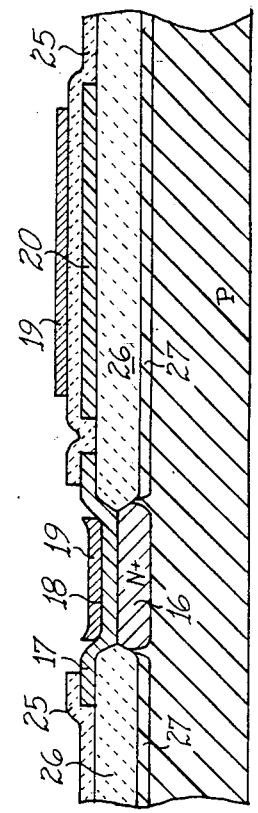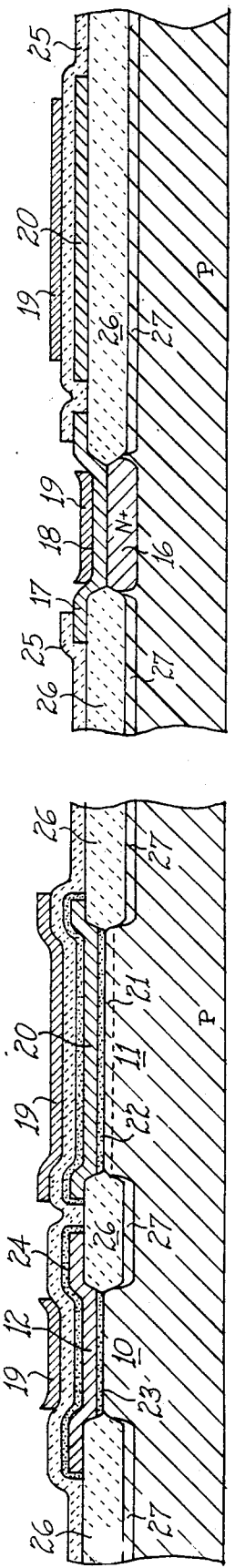
Fig. 3a
Fig. 3b
Fig. 3c

METHOD OF MAKING HIGH DENSITY DYNAMIC MEMORY CELL

This is a division of application Ser. No. 133,376 filed Mar. 21, 1980 now U.S. Pat. No. 4,376,983.

RELATED CASES

This application is related to application Ser. No. 133,375, now U.S. Pat. No. 4,240,092 filed herewith by the inventors hereof, assigned to Texas Instruments.

BACKGROUND OF THE INVENTION

This invention relates to semiconductor memory devices and methods of manufacture, and more particularly to a one-transistor dynamic read/write memory of the N-channel silicon gate type.

Dynamic read/write memory cells made by the double-level polysilicon N-channel self-alligned process commonly used in the industry are shown in pending U.S. Pat. No. 4,240,092, filed Jan. 12, 1976 and Ser. No. 722,841, filed Sept. 13, 1976, by C-K Kuo, assigned to Texas Instruments, as well as in Electronics, Feb. 19, 1976, pp. 116–121, May 13, 1976, pp. 81–86, and Sept. 28, 1978, pp. 109–116.

In prior cells, the "bit" lines (Y or column input/output lines) are formed of N+ diffused silicon, or in some cases of polysilicon strips. The series resistance of bit lines formed of diffused silicon or poly can become a problem in large arrays, especially as the sizes are scaled down for maximum density. It would be preferable to use aluminum for the bit lines due to its higher conductivity. However, the space needed for metal-to-silicon contacts results in large cell sizes when metal bit lines are employed. The N+ "moat" area heretofore has been made much larger than the contact area to allow for missallignment tolerance of the contact hole; metal must not touch the edge of the moat because of leakage caused by such a condition.

Another problem in prior dynamic memory cells is errors induced by ambient alpha particles. Storage capacitors can be discharged by this radiation.

It is the principal object of this invention to provide an improved dynamic read/write memory. Another object is to provide a dynamic memory of reduced cell size. An additional object is to provide a dense array of memory cells, made by a more efficient method. A further object is to provide an improved way of making metal-to-silicon contacts in memory cells. Another object is to provide alpha particle protection in memory cells.

SUMMARY OF THE INVENTION

In accordance with an illustrative embodiment of the invention a dynamic read/write memory cell of the one transistor N-channel silicon gate type is made by a triple-level polysilicon process which allows the bit lines to be formed by metal strips which have low resistance and which can cover the storage capacitors for alpha particle protection. Metal-to-silicon contacts are made through an intervening polysilicon segment which allows the underlying N+ silicon region to be much smaller than in prior cells.

In co-pending application Ser. No. 801,699, filed May 31, 1977, now U.S. Pat. No. 4,209,716 assigned to Texas Instruments, the use of a second-level poly segment to make a metal-to-moat contact is illustrated in a static RAM cell.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 3a–3c are elevation views in section of the cells of FIG. 1, taken along the lines a—a, b—b, and c—c, respectively.

DETAILED DESCRIPTION OF SPECIFIC EMBODIMENTS

Figure 1:
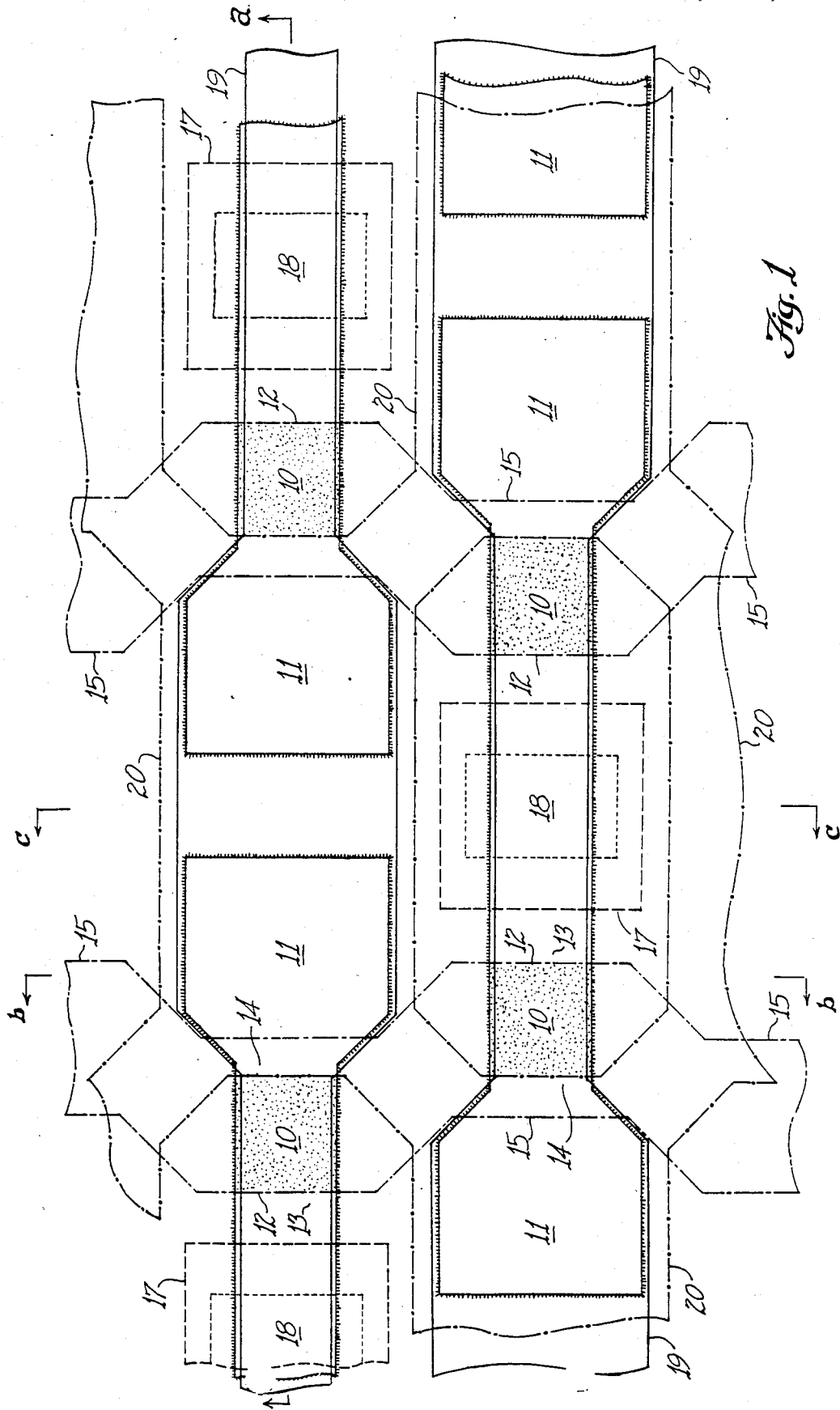
FIG. 1 is a greatly enlarged plan view of a small portion of a semiconductor chip showing the physical layout of a part of a cell array employing memory cells made according to the invention.
Figure 2:
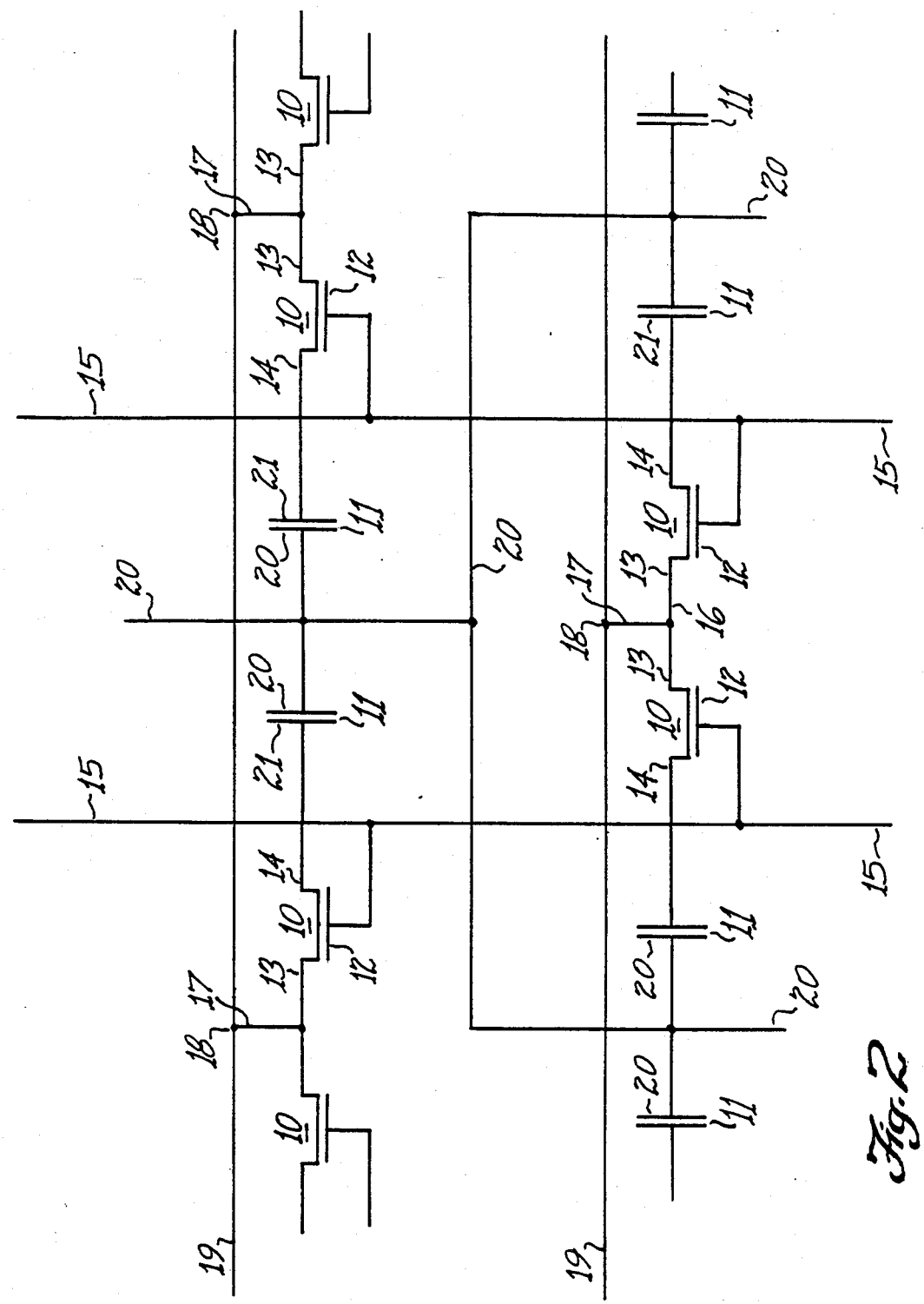
FIG. 2 is an electrical schematic diagram of the part of the cell array of FIG. 1.

With reference to FIGS. 1, 2, and 3a–3c, a one-transistor dynamic memory cell is illustrated which is made according to the invention. The array consists of a large number of cells, only four of which are shown. Each cell includes an access transistor 10, and a storage capacitor 11. The access transistor 10 has a gate 12, a source 13 and a drain 14. The gates 12 are parts of elongated second-level polysilicon strips 15 which are the X or word address lines for the array. The sources 13 are parts of N+ diffused moat regions 16 which are connected via third-level polysilicon areas 17 at metal-to-silicon contacts 18 to metal strips 19 which are the bit lines or Y output lines. The capacitors 11 include a first level polysilicon bias gate 20 which is part of a web of polysilicon extending over the entire array and connected to the Vcc supply, ordinarily +5 V. The lower plates of the capacitors 11 are created by inverted regions 21 beneath the gates 20.

A thin gate oxide layer 22 separates the first level polysilicon bias gate 20 from the silicon surface, and another thin gate oxide layer 23 separates the second level poly transistor gate 12 from the silicon and from the first level poly gate 20 in each cell. The second level poly in turn is insulated from the third level poly 17 by an oxide layer 24, in the event that the third level overlaps the second level. A thick layer 25 of low temperature deposited oxide overlies the upper level of polysilicon. A thick thermal field oxide coating 26 covers parts of the bar not occupied by the transistors or diffused interconnects (moat regions), and P+ channel stop regions 27 are formed underneath all the thick field oxide.

The array is formed on a silicon bar 30 which would typically contain perhaps 64K or 256K bits on a bar less than about 200 mils on a side or 40,000 square mil area, depending upon the bit density. The four cells shown would be on a minute part of the bar, perhaps about one mil wide. A 64K cell array would require 256 of the polysilicon X address lines 15 and 256 of the metal Y lines 19, providing 65,536 bits.

Turning now to FIGS. 4a–4e, a process for making the cell array of the invention will be described. The starting material is a slice of P-type monocrystalline silicon, typically four inches in diameter and twenty mils thick, cut on the <100> plane, of a resistivity of about 6 to 8 ohm-cm. As mentioned above, in the figures the portion shown of the bar 30 represents only a very small part of the slice, perhaps 1 or 2 mils wide. After appropriate cleaning, the slice is oxidized by exposing to oxygen in a furnace at an elevated temperature of perhaps 1100° C. to produce an oxide layer 31 over the entire slice of a thickness of about 1000 Å. Next, a layer 32 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which defines the desired pattern of the thick field oxide 26 and the P+ channel stops 27. The resist is developed, leaving areas where nitride is then removed by etching the exposed part of the nitride layer 32 but leaving in place the oxide layer 31.

Using photoresist and nitride as a mask, the slice is subjected to an implant step to produce the channel stop regions; to this end boron atoms are introduced by ion implant into unmasked regions 33 of silicon. The regions 33 will not exist in the same form in the finished device, because silicon is consumed in the field oxidation procedure. Usually the slice is subjected to a heat treatment after implant but prior to field oxide growth, as set forth in U.S. Pat. No. 4,055,444, assigned to Texas Instruments.

Figure 4A:
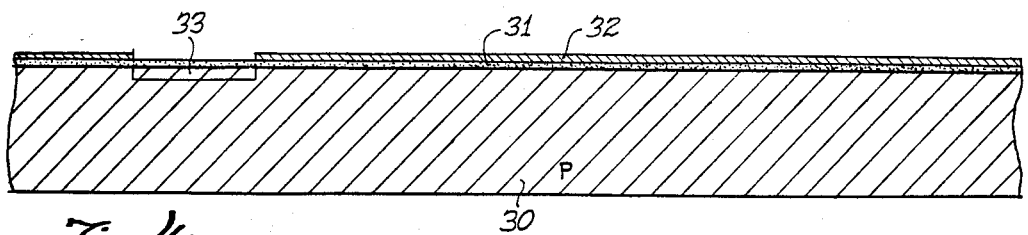
FIGS. 4a–4e are elevation views in section of the cell array of FIGS. 1 and 3a–3c, at successive stages in the manufacturing process, taken generally along the line a—a in FIG. 1.
Figure 4B:
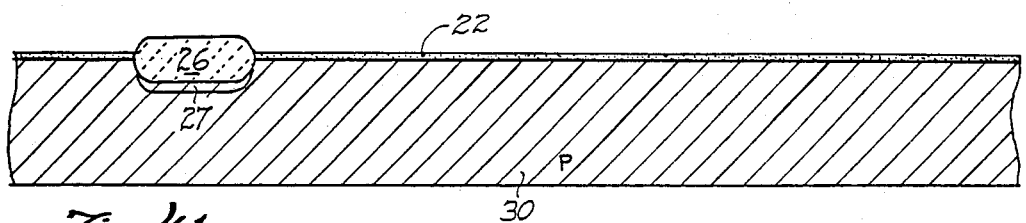

The next step in the process is the formation of field oxide 26, by subjecting the slices to steam or an oxidizing atmosphere at about 900° to 1000° C. for several hours. This causes a thick field oxide layer 26 to be grown as seen in FIG. 4b, extending into the silicon surface as silicon is consumed upon oxidation. The remaining parts of the nitride layer 32 mask oxidation. The thickness of this layer 26 is about 10000 Å, part of which is above the original surface and part below. The boron doped P+ regions 33 formed by implant are partly consumed, but also diffuse further into the silicon ahead of the oxidation front to produce P+ field stop regions 27 which are much deeper than the original regions 33.

Next the remaining nitride layer 32 is removed by an etchant which attacks nitride but not silicon oxide, then the oxide 31 is removed by etching and the exposed silicon cleaned. The first gate oxide 22 is grown by thermal oxidation to a thickness of about 500 Å. In areas of the slice where depletion load devices are required, although not pertinent to this invention, a masked ion implant step would be done at this point. Likewise, the threshold voltage of the enhancement mode transistors in the cell array or in the periphery may be adjusted by another ion implant.

Figure 4C:
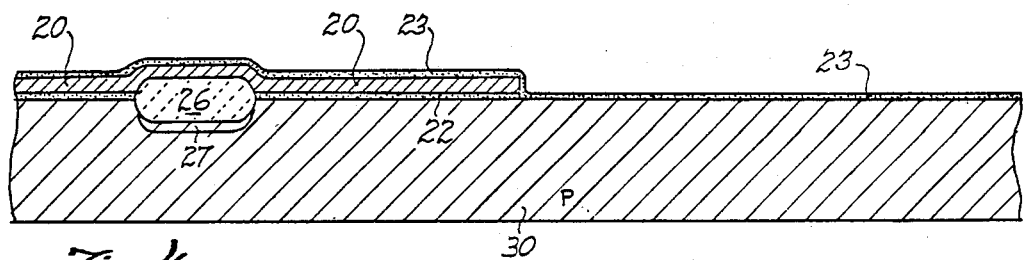

As seen in FIG. 4c a first layer of polycrystalline silicon is deposited over the entire slice in a reactor using standard techniques to a thickness of about 5000 Å. This layer is doped with phosphorus by an N+ diffusion or implant to make it highly conductive. This first level polysilicon layer is patterned by applying a layer of photoresist, exposing to ultraviolent light through a mask prepared for this purpose, developing, then etching the exposed polysilicon to define the capacitor gate 20 in the cell array.

Figure 4D:
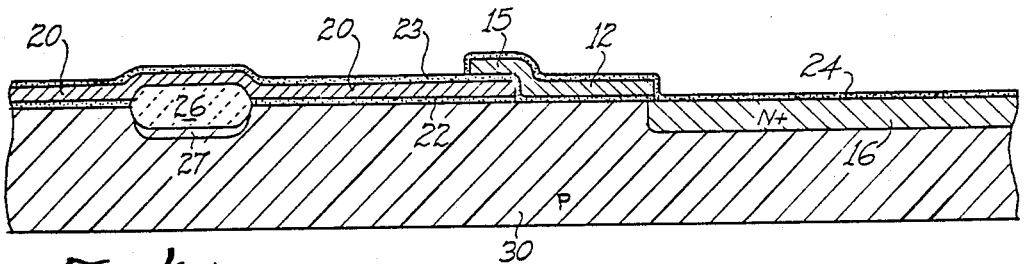
Figure 4E:
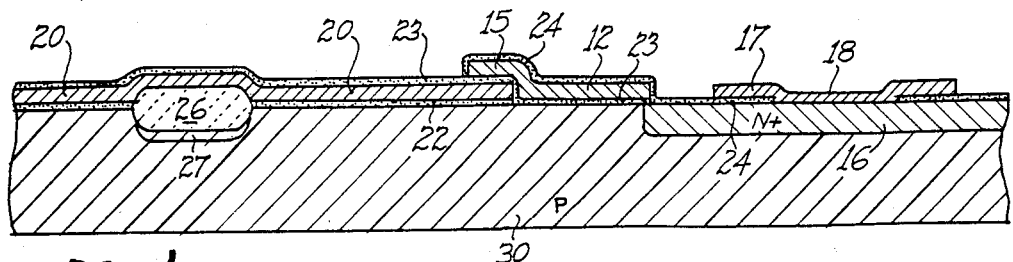

The upper surface of the first level polysilicon as well as exposed silicon is oxidized by exposing the slice to an oxidizing atmosphere at 900° to 1000° C. to create the thermal oxide layer 23 over the channels of the transistors 10 and over the capacitor gates 20 to a thickness of about 500 Å. A second level of polycrystalline silicon is next deposited over the slice, then masked by photoresist and etched to leave the X address line 15 which also form the gate 12. As seen in FIG. 4d, the slice is now subjected to an arsenic implant which creates the N+ regions 13 and 16, masked by the second level poly gate 12 and the photoresist used to define it. The upper surface of the second level poly 15 is thermally oxidized as before to form the layer 24 in case the third level poly overlaps the second level. The exposed silicon over the N+ region 16 is also coated with the oxide 24.

The contact window 18 is next created. A photoresist operation masks all of the top surface of the slice except an area where the windows 18 are to exist. Using this photoresist as a mask, the thermal oxide 24 is removed to expose the upper surface of the N+ region 16, at the window 18. Third level polysilicon is then deposited over the entire slice, doped by N+ implant or diffusion, and patterned by a photoresist operation to leave the segments 17.

A thick layer 25 of silicon oxide is deposited by decomposition of silane at a low temperature, about 400° C. This layer 25 insulates the metal level from the layers of polycrystalline silicon, and is referred to as multilevel oxide.

Referring to FIGS. 1 and 3a, the multilevel oxide layer 25 is now patterned by a photoresist operation, exposing the contact areas 18 for metal-to-poly-to-silicon contacts along the bit lines 19 in the cell array (and contact areas for a metal-to-silicon or metal-to-poly contact for peripheral transistors). Metal contacts and interconnections are used in the periphery of the chip in the input buffers, decoders, sense amplifiers, and the like, as well as for the bonding pads which provide connection to external electrodes. The metal contacts and interconnections are made in the usual manner by depositing a thin film of aluminum over the entire top surface of the slice then patterning it by a photoresist mask and etch sequence. This leaves the metal strips 19.

An advantage of the cell structure of the invention is that the contact window 18 for two adjacent cells is positioned over the N+ moat region 16 without making the region 16 large enough to avoid metal contact at the edge of a moat. That is, the contact window 18 can be as wide as or wider than the width of the N+ region, without degrading the device at the metal contact areas. This is made possible by the process which allows poly segments 17 over N+ moat regions. Also, it is significant that alignment and spacing of the third level poly segment 17 is not critical; the third level poly can overlap the second level poly strips 15 or first level poly web 20 without harm. In addition, the process allows the bit line 19 to be formed of metal which has much lower resistance than N+ moat or polysilicon. The metal bit lines 19 are broader at areas 35 directly over the capacitors 11, covering the capacitors with a layer of aluminum which provides alpha particle protection. The layout avoids various critical alignment problems heretofore encountered. A smaller cell size is provided, compared to prior cells.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a dynamic semiconductor memory cell of the one-transistor type comprising the steps of:
    applying a first layer of conductive material on a face of a body of semiconductor material, said first layer being separated from a capacitor region of said face by thin insulator,
    applying a second layer of conductive material onto said face partially overlying the first layer but separated therefrom by an insulator, the second layer being patterned to define an elongated strip and a transistor gate, the gate overlying a channel region of said face but being separated therefrom by thin insulator,
    forming a heavily-doped region in said face adjacent said channel region,
    applying a third layer of conductive material onto said face overlying a part of said heavily-doped region, the third layer being wider than said heavily-doped region but being spaced from said first and second layers along the face, and
    applying a layer of metal over said face contacting said third layer at a contact window over said part of said region.

2. A method according to claim 1 wherein the semiconductor body is P-type silicon, the heavily doped region is N+, and the conductive material is polycrystalline silicon.

3. A method according to claim 2 wherein the second layer is patterned to define a first elongated strip defining an address line before the third layer is applied.

4. A method according to claim 3 wherein the first layer is patterned to define a bias gate for the capacitor partially underlying the first elongated strip.

5. A method according to claim 4 wherein a thick insulator separates said layer of metal from said face except at said contact window.

6. A method according to claim 5 wherein a coating of thick thermal field oxide is formed on said face before applying said first conductive layer, except in the capacitor region, the channel region and the heavily doped region.

7. A method according to claim 6 wherein an array of said cells is formed at said face, and the layer of metal includes parallel strips of metal, each strip contacting a plurality of cells in a column.

8. A method according to claim 7 wherein each strip of metal includes wide areas completely covering the capacitor regions for alpha particle shielding.

9. A method of making a semiconductor device comprising the steps of:
    applying a first layer of conductive material over a face of a semiconductor body to form electrodes overlying first semiconductor regions,
    applying a second layer of conductive material on said face partially overlying the first layer and also overlying second semiconductor regions, each of the second semiconductor regions being adjacent a first semiconductor region,
    forming a plurality of heavily-doped regions in said face each adjacent one of said second semiconductor regions,
    applying a third layer of conductive material on said face contacting a plurality of said heavily-doped regions, and
    applying a metal layer to said face to define a plurality of elongated strips overlying the first and second regions and making contact to the heavily-doped regions via said third layer.

10. A method according to claim 9 wherein the conductive material is polycrystalline silicon and a thin insulator separates said electrodes from the face and separates the second layer from the first layer.

11. A method according to claim 9 wherein the step of applying a layer of metal to said face after the third layer includes patterning the metal to define a plurality of parallel elongated metallic strips contacting the heavily doped regions via said third layer, the metallic strips making electrical contact to the face of the body at alternately spaced positions.

12. A method according to claim 11 wherein the step of patterning the metal includes leaving wide areas totally covering said first semiconductor regions for radiation shielding.

13. A method of making an array of rows and columns of dynamic memory cells comprising the steps of:
    forming a field insulator coating on a face of a semiconductor body surrounding a plurality of elongated cell areas on said face, said elongated cell areas extending parallel with said columns,
    applying a first layer of conductive material onto said face patterned to cover capacitor regions of the face at the opposite ends of each of said cell areas, said first layer being insulated from the face by a capacitor dielectric,
    applying a second layer of conductive material onto said face patterned to form a plurality of elongated row lines extending across said cell areas perpendicular to said columns and over said field insulator, row lines providing transistor gates above channel regions of the face in the cell areas between a central part of each cell area and said opposite ends, said second layer being insulated from the first layer by a insulative coating,
    applying a third layer of conductive material onto said face patterned to form a plurality of column lines extending across said cell areas and over said first and second layers but insulated therefrom, each of such column lines making electrical connection to said central parts of a plurality of said cell areas in a column.

14. A method according to claim 13 wherein said first and second layers of conductive material are polycrystalline silicon and said third layer of conductive material is metal.

15. A method according to claim 13 wherein each cell area has two capacitors, one at each of said opposite ends, and has two transistors, one at each of said gates, to thereby provide two memory cells having a common connection at said central part.

* * * * *